United States Patent [19]
Hurwitt et al.

[11] Patent Number: 5,474,667
[45] Date of Patent: Dec. 12, 1995

[54] REDUCED STRESS SPUTTERING TARGET AND METHOD OF MANUFACTURING THEREFOR

[75] Inventors: Steven D. Hurwitt, Park Ridge, N.J.; Tugrul Yasar, Woodstock, N.Y.; Bhola N. De; Jon S. Hsu, both of Congers, N.Y.

[73] Assignee: Materials Research Corporation, Orangeburg, N.Y.

[21] Appl. No.: 199,627

[22] Filed: Feb. 22, 1994

[51] Int. Cl.⁶ .................................................. C23C 14/34
[52] U.S. Cl. ............................... 204/192.12; 204/298.12; 228/101
[58] Field of Search ........................ 204/192.12, 198.12; 228/101

[56] References Cited

U.S. PATENT DOCUMENTS 4,855,033  8/1989  Hurwitt ............................... 204/298.09

FOREIGN PATENT DOCUMENTS

| | | | |
|---|---|---|---|
| 61-166965 | 7/1986 | Japan | 204/298.12 |
| 5-59540 | 3/1993 | Japan | 204/298.12 |
| 5-230638 | 9/1993 | Japan | 204/298.12 |
| WO92/13115 | 8/1992 | WIPO | 204/298.12 |

Primary Examiner—Aaron Weisstuch
Attorney, Agent, or Firm—Wood, Herron & Evans

[57] ABSTRACT

A sputtering target assembly in which the region of attachment between the sputtering target and the backing plate has varying stiffness, thereby reducing stresses in the target during sputtering. In the region of attachment, the backing plate has varying thickness, for example a smooth taper. Alternatively, the backing plate may include structures which affect the stiffness of the backing plate in the region of attachment. These structures may be defined by machining, molding or forging during manufacture of the backing plate, or by machining or drilling voids in the backing plate. As a second alternative, the bonding material used to attach the sputtering target and the backing plate may have a varying stiffness across the region of attachment.

25 Claims, 4 Drawing Sheets

REDUCED STRESS SPUTTERING TARGET AND METHOD OF MANUFACTURING THEREFOR

FIELD OF THE INVENTION

The invention relates to target assemblies used to sputter material onto a substrate in a chamber, typically at a reduced pressure.

BACKGROUND OF THE INVENTION

A sputtering target assembly typically includes a front section of sputtering material (e.g., Silicon compounds, Tungsten, Titanium, Iron, Terbium, Cobalt, Copper) which is sputtered during operation, and a backing plate of copper or other structural metal. The backing plate provides support to the target material during handling and mounting, seals the target assembly to an aperture in the process chamber, provides channels carrying cooling water and provides a thermally conductive path for heat flow from the target material to the cooling water. The target material is typically bonded to the backing plate by low melting point solder.

The target material is often brittle. A leading cause of target failure is cracking in the target material.

SUMMARY OF THE INVENTION

There are several sources of stress on the target material which can lead to cracking. Pressure differentials, generated between the near vacuum in the processing chamber and the atmospheric pressure and cooling water pressure on the outside of the chamber, cause the target assembly to strain inward (toward the vacuum chamber) during processing under vacuum. The extent of the deflection is related to the rigidity of the backing plate; a thick, stiff backing plate resists deflection and results in lower stress on the target material.

Thermo-mechanical stress can be even more damaging. Thermal stress is generated by temperature gradients between the target material and the backing plate. These temperature gradients are a natural result of cooling the target by removing heat through the backing plate, and therefore these gradients are difficult to eliminate. Thermal stress is also generated by temperature gradients within the target material itself, as a result of uneven power density applied to the target during sputtering. The pattern of power density applied to the target can be controlled; however, an uneven power density is often necessary to achieve the desired deposition uniformity on the wafer, therefore, uneven power density and the resulting thermal stresses are also difficult to eliminate.

In general, these thermal stresses are generated when the thermally expanding target material attempts to bend the backing plate into a conforming shape. A thin, flexible backing plate is more easily re-shaped by the target, resulting in lower target stress than that generated with a more rigid backing plate. Thus, thermo-mechanical stresses generally increase as the backing plate becomes more rigid, whereas the pressure differential stresses generally decrease as the backing plate becomes more rigid.

However, it has now been found that these two categories of stress (thermo-mechanical and pressure differential) do not occur in the same areas of the target; therefore, it is possible to tailor the stiffness of the backing plate to the process conditions and characteristics of the target material, so that the target stress is minimized.

Thus, in accordance with one aspect, the invention features a sputtering target assembly in which the region of attachment between the sputtering plate and the backing plate has a varying stiffness.

In specific embodiments, the backing plate has a varying thickness across said region, for example a smooth taper. Alternatively, the backing plate may include structures which affect the stiffness of the backing plate in the region of attachment. These structures may be defined by machining, molding or forging during manufacture of the backing plate, or by machining or drilling voids in the backing plate.

In another aspect, the invention features a sputtering target assembly in which the bonding material used to attach the sputtering plate and the backing plate has a varying stiffness across the region of attachment. In specific embodiments, the bonding material is solder and has a varying thickness across the region of attachment.

In further aspects, the invention features methods of manufacturing a sputtering target assembly to incorporate the above-described features.

The above and other objects and advantages of the present invention shall be made apparent from the accompanying drawings and the description thereof.

BRIEF DESCRIPTION OF THE DRAWING

The accompanying drawings, which are incorporated in and constitute a part of this specification, illustrate embodiments of the invention and, together with a general description of the invention given above, and the detailed description of the embodiments given below, serve to explain the principles of the invention.

DETAILED DESCRIPTION OF SPECIFIC EMBODIMENTS

Figure 1:
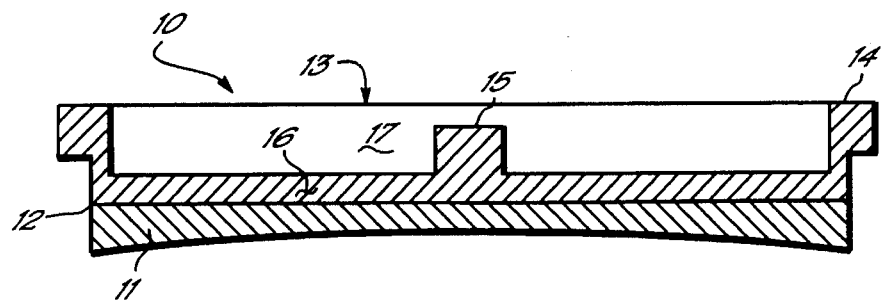
FIG. 1 is a cross-sectional view of a target and backing plate assembly of conventional design.

As illustrated in FIG. 1, a conventional target assembly 10 includes a circular sputtering plate 11 (shown in cross-section) of target material, for example having a five inch radius. The sputtering plate is attached by solder or other suitable bonding material 12 to a backing plate 13. Backing plate 13, which is also circular in shape, includes a flange 14 and central hub 15 which are mounted to the processing chamber and support the target material. Cooling water flows in the dish-shaped recess 17 behind the backing plate.

Typically, region 16 of the backing plate has a substantially constant thickness of about one-quarter to one third of an inch. The specific target assembly illustrated in FIG. 1 has a five-inch radius, and includes a silicon or silicon oxide (SiO$_2$) sputtering plate solder-bonded to a copper (Cu) backing plate having a 0.310 inch thickness in region 16. The sputtering plate has a thickness of one-quarter inch of silicon sputtering material.

Figure 2:
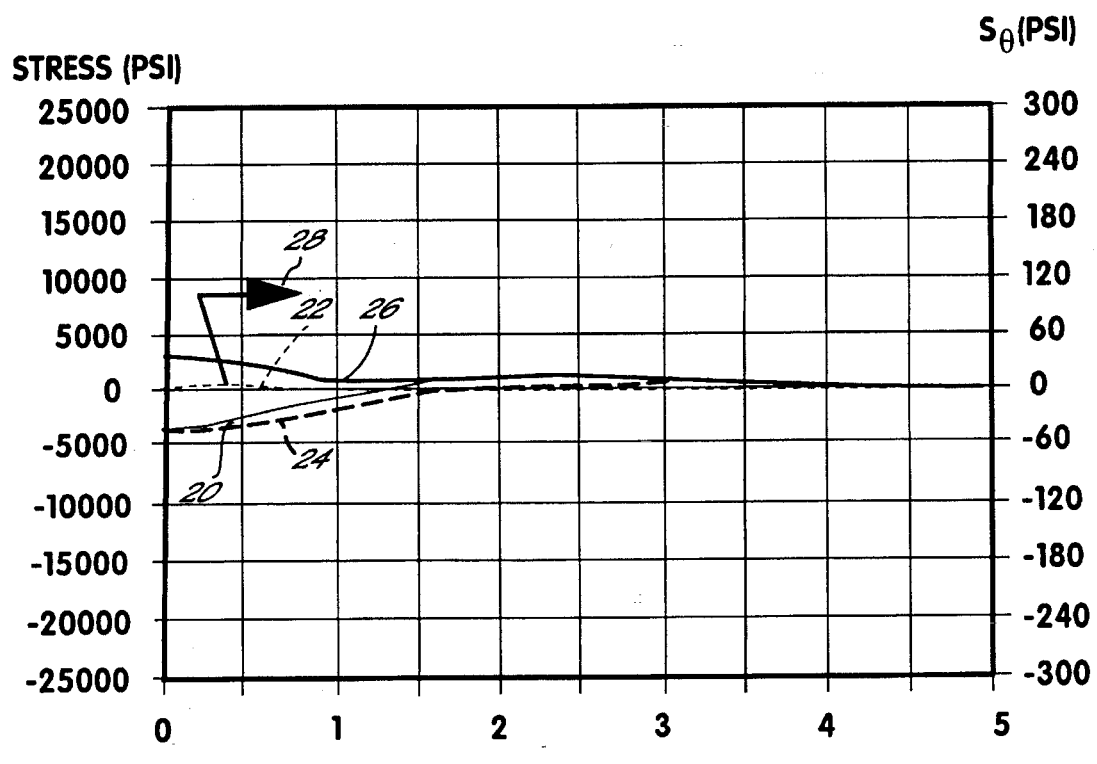
FIG. 2 is a plot of the stress pattern in the target of FIG. 1 caused by atmospheric and cooling water pressure differentials.
Figure 3:
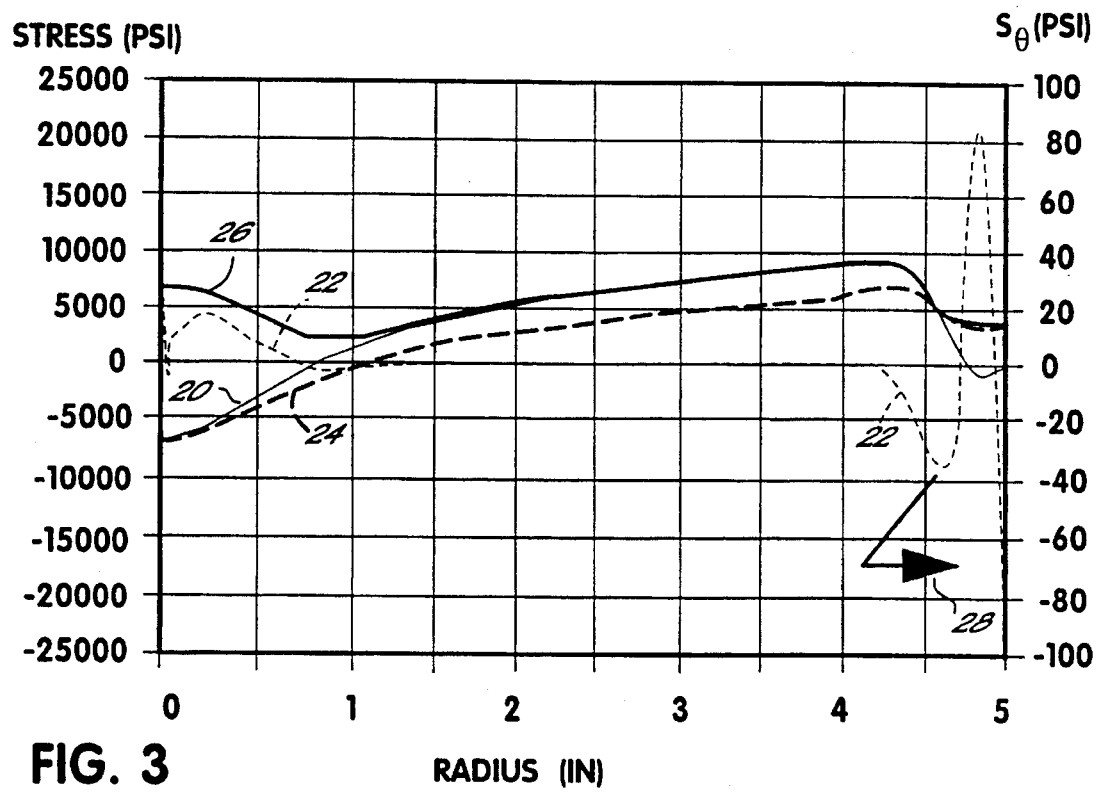
FIG. 3 is a plot of the stress pattern in the target of FIG. 1 caused by thermo-mechanical forces resulting from process heating.
Figure 4:
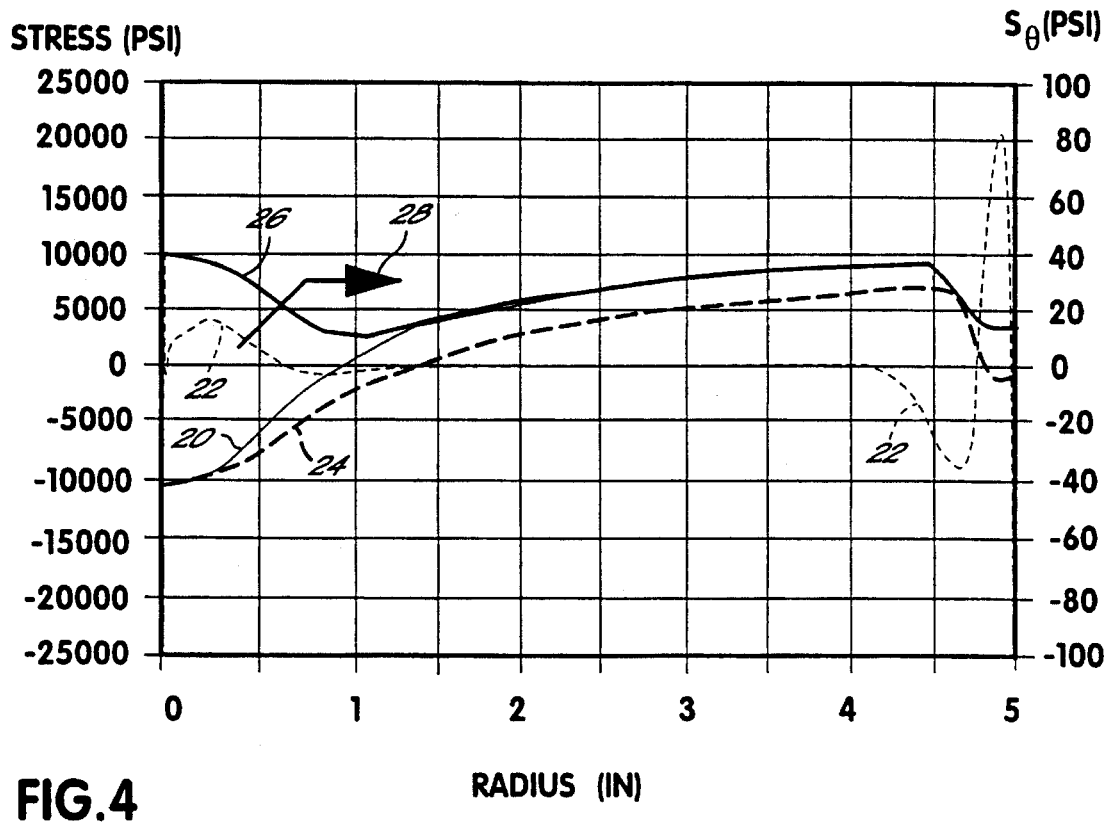
FIG. 4 is a plot of the stress pattern in the target of FIG. 1 when pressure differentials and thermo-mechanical forces are applied, simulating actual use.

When subjected to atmospheric and cooling water pressure, the assembly 10 of FIG. 1 becomes stressed. The plots of FIGS. 2–4 illustrate these stresses. These plots were generated by a computer model using the "GEOSTAR" geometric modelling software with the "COSMOS/M" finite element analysis system, available from Structural Research and Analysis Corporation, 2951 28th Street, Suite 1000, Santa Monica, Calif. 90405. For the purposes of the model, it was assumed that flange 14 and hub 15 are fixedly mounted to the processing chamber so as to prevent any appreciable movement of flange 14 and hub 15. Thus, for the model, flange 14 and hub 15 were defined as fixed locations; the model identifies stress in the region 16 between the hub 15 and flange 14.

Each plot identifies three components of stress as a function of the radial distance from the center of hub 15 in a cylindrical coordinate system. The stress components are a radial or r-direction stress $S_r$ in the radially-outward direction, a hoop or θ-direction (tangential) stress $S_\theta$ in a direction perpendicular to the plane of the cross-section shown in FIG. 1, and a vertical or z-direction stress $S_z$ in a direction parallel to the central axis of hub 15. The plots also show the combined stress intensity, which is a measure of the total fracturing force experienced at each radial location.

FIG. 2 shows the stress patterns when the chamber is subjected to stress from atmospheric pressure (approximately 15 pounds per square inch) and water pressure (approximately 40 pounds per square inch), a total stress of approximately 55 pounds per square inch. The resulting radial stress $S_r$ is plotted on line 20, the tangential stress $S_\theta$ is plotted on line 22, the vertical stress $S_z$ is plotted on line 24, and the stress intensity is plotted on line 26. The radial stress line 20, vertical stress line 24, and stress intensity line 26 are plotted with reference to the left-hand axis; the tangential stress line 22 is plotted with reference to the right-hand axis, as indicated by arrow 28.

As can be seen in FIG. 2, the stresses produced by atmospheric and water pressure approach a magnitude of 3000 pounds per square inch, and are focussed near the center of the target assembly (i.e., near to hub 15).

FIG. 3 is a plot of the magnitude of these stresses when the target assembly is subjected to thermal stress caused by uneven heat flux from the surface of the sputtering plate 11 through the backing plate 13 and into the cooling water recess 17. FIG. 3 models a typical process using a silicon target with an argon-oxygen gas plasma, or alternatively using a silicon target with an argon-nitrogen gas plasma. The silicon nitride process consumes 4.2 kilowatts of electrical power, and produces a sputter deposition rate of about 43 Angstroms of silicon nitride per second. For a silicon nitride process, this power level is achieved at a power supply voltage of 600 Volts and about 7 Amperes of current; in a silicon oxide process this power level is achieved at a power supply voltage of 325 Volts and about 12.9 Amperes of current. At this power level, the temperature of the target surface raises to approximately 87 degrees Fahrenheit. The heat flow from the plasma into the sputtering plate is approximately proportional to the (empirically measured) erosion rate at the target and is modelled as such. There is greater erosion near to the outer rim of the sputtering plate and therefore greater modelled heat flow in this area.

As illustrated in FIG. 3, the thermal stresses approach 7500 pounds per square inch, and are focussed at the center and the outer rim of the target assembly.

FIG. 4 shows the stress values when the target assembly is simultaneously subjected to thermal stress from uneven heat flux and to atmospheric and water pressure. The stresses exceed a magnitude of 9000 pounds per square inch, and vary substantially across the surface of the sputtering plate. Stresses are focussed both near the center of the target assembly and near the rim. The large stress variation, and large absolute stress magnitudes, strongly promote cracking in the target material.

A difficulty with reducing these stresses is that while the pressure stresses can be reduced by increasing the thickness of the backing plate, doing so only increases the thermal stresses caused by uneven heat flux. Cracking is caused by both stresses, so it is insufficient to cure one at the expense of the other. Thus, even when the thickness of backing plate along the radial region 16 is increased to greater than three-quarters of an inch (at a substantial increase in cost), cracking in the sputtering plate is not eliminated.

Figure 5:
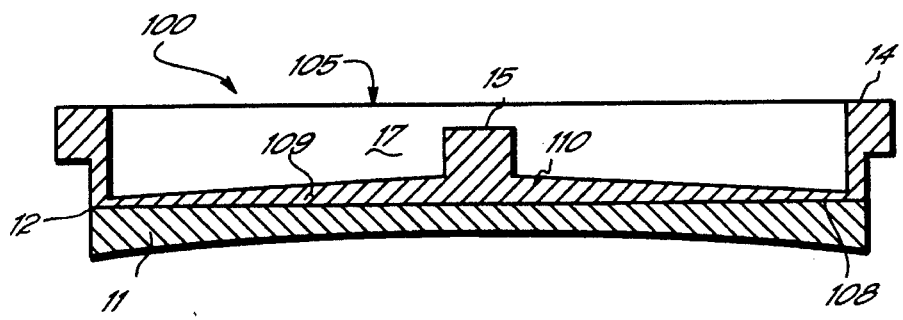
FIG. 5 is a cross-sectional view of a target and backing plate assembly in accordance with principles of the present invention.

FIG. 5 illustrates a target assembly 100 in accordance with principles of the present invention which is effective in reducing cracking without substantial cost increase. Assembly 100 differs from assembly 10 shown in FIG. 1 in the design of the region 109 of the backing plate. The target material 11, bonding material 12, rim 14, and hub 15 have the same configuration as the conventional target assembly of FIG. 1. However, unlike region 16 in FIG. 1, region 109 in FIG. 5 has a non-constant thickness. Specifically, the thickness of region 109 varies with the radius away from hub 15. At radii near to hub 15, region 109 is relatively thick and therefore stiffer, whereas at radii distant from hub 15, region 109 is relatively thin and therefore less stiff. The configuration of region 109 changes the stress patterns in the sputtering plate, and results in reduced overall stress in the target material 11.

This surface configuration can be formed during a molding or forging process used to create the backing plate, or alternatively by removing portions of a plate by machining (e.g., turning the plate on a lathe).

The appropriate thickness variation will be different for different target and backing plate materials, different target diameters, and different expected processing conditions. However, for the target and processing materials and conditions described above, the appropriate thicknesses are approximately 0.05 inches in area 108 near to rim 14 of the backing plate and approximately 0.31 inches in area 110 near to hub 15 of the backing plate.

Figure 6:
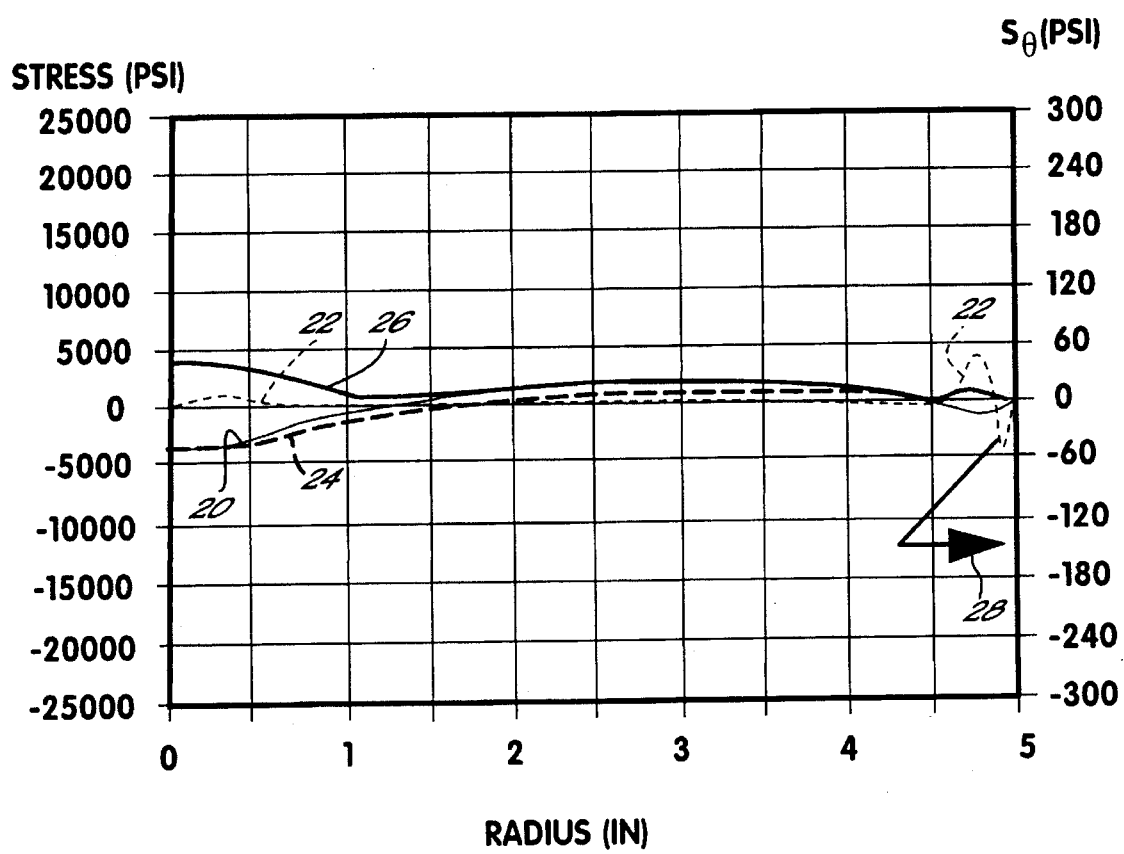
FIG. 6 is a plot of the stress pattern in the target of FIG. 5 caused by atmospheric and cooling water pressure differentials.

FIG. 6 shows the stresses produced in the target assembly of FIG. 5 under the atmospheric and water pressure conditions described above with reference to FIG. 2. As is apparent from the plots, although the stress is still concentrated at the hub of the target assembly, there is some measurable spreading of the stress along the radius of the target assembly.

Figure 7:
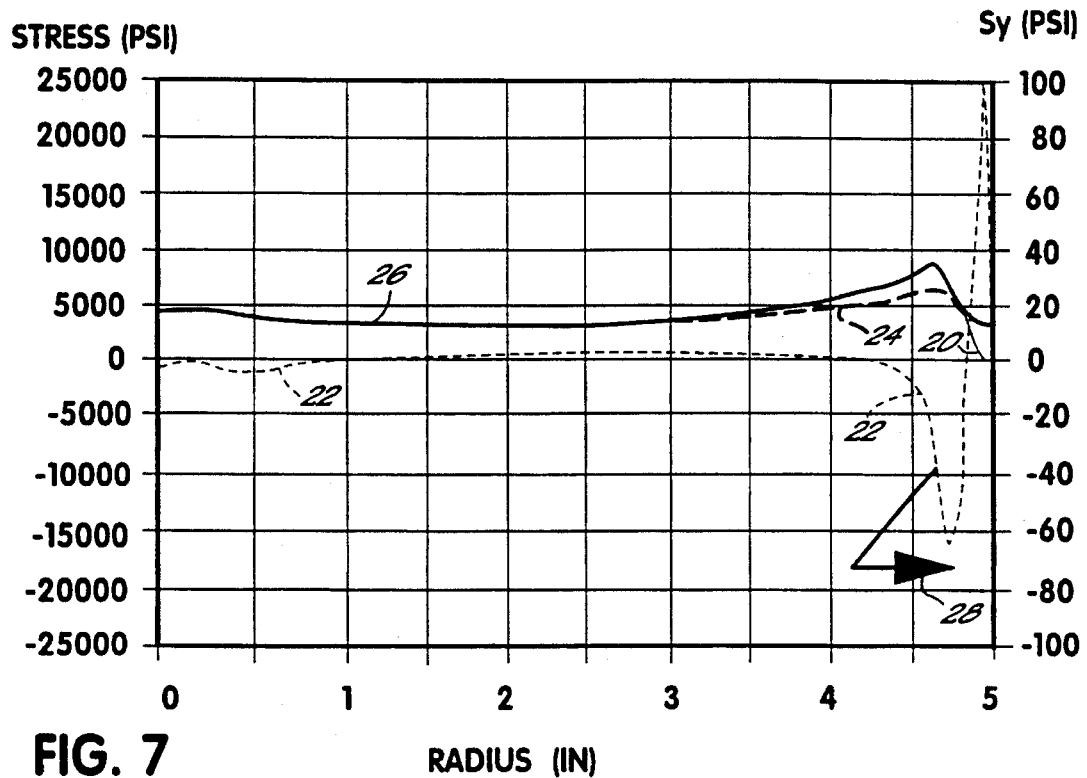
FIG. 7 is a plot of the stress pattern in the target of FIG. 5 caused by thermo-mechanical forces resulting from process heating.

FIG. 7 shows the stresses produced in the target assembly of FIG. 5 under the thermal stress conditions described above with reference to FIG. 3. Here again, while there is some stress concentration, the stress is substantially more even along the radius of the target assembly.

Figure 8:
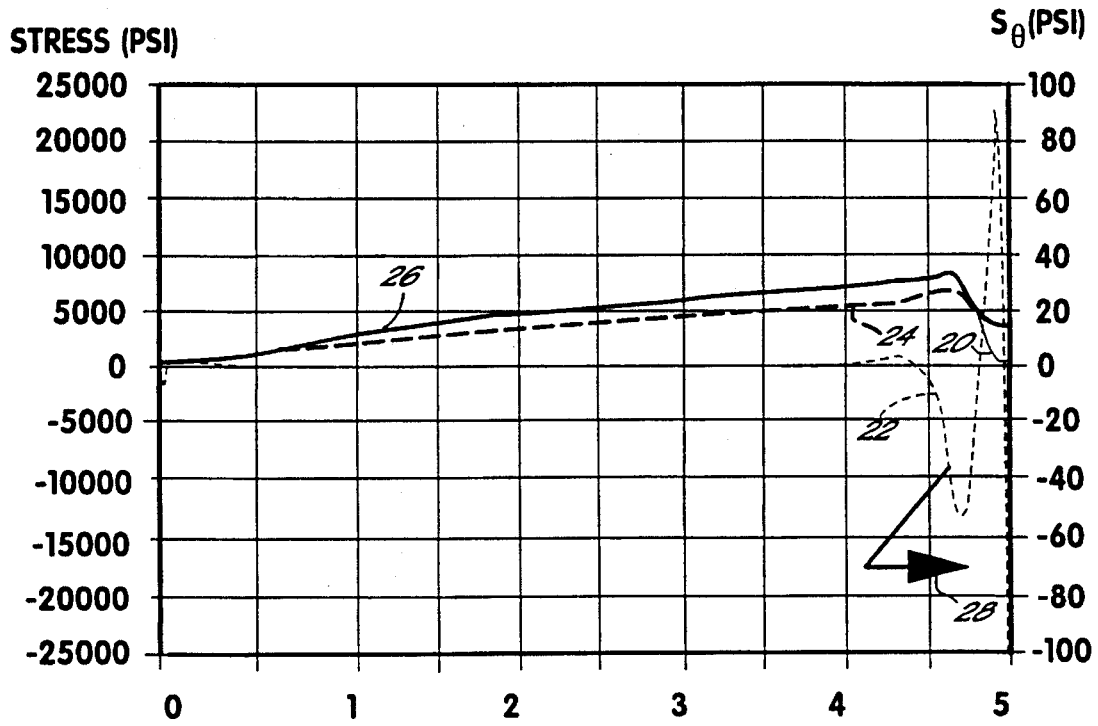
FIG. 8 is a plot of the stress pattern in the target of FIG. 1 when pressure differentials and thermo-mechanical forces are applied, simulating actual use.

FIG. 8 shows the stresses produced when the target assembly of FIG. 5 is subjected to both thermal and atmospheric and water pressure stress. The resulting stress patterns are far more even than the corresponding patterns shown in FIG. 4; furthermore, the absolute magnitude of the stresses approach only 7500 pounds per square inch, a substantial reduction from the over 9000 pounds per square inch in FIG. 4.

Thus, in accordance with principles of the invention, the stress in a target assembly is substantially reduced by forming the backing plate so that it has varying stiffness across its surface, and thereby reduces and spreads the thermal and pressure stresses.

While the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art.

For example, the transition in the thickness of the backing plate need not be a smooth, linear, and radially uniform taper as illustrated in FIG. 5. Other transitional shapes may be used, for example, a series of steps, a non-linear taper, a radially non-uniform taper or series of steps, or any other shape.

Furthermore, the stiffness of the backing plate may be varied by methods other than varying the thickness of the backing plate surface. For example, the stiffness of the backing plate may be varied by ribs or stiffeners on the backing plate. These structures may be cast into the backing plate, or, alternatively, material may be selectively removed from the backing plate by drilling or machining to produce the desired stiffness variation.

In another embodiment, stress is reduced by varying the stiffness of the coupling between the target and the backing plate, rather than, or in addition to, varying the stiffness of the backing plate per se. The stiffness of the coupling can be varied by, for example, varying the thickness of the solder or other bonding material which creates the coupling.

The invention in its broader aspects is therefore not limited to the specific details, representative apparatus and method, and illustrative example shown and described. Accordingly, departures may be made from such details without departing from the spirit or scope of applicant's general inventive concept.

What is claimed is:

1. A sputtering target assembly comprising a sputtering target of sputtering material having a sputtering face and a rear face, and a backing plate, a region of said backing plate attached to said rear face of said sputtering target, said target being subjected to localized thermo-mechanical and pressure differential stresses at different locations within said target during a sputtering operation, said region of said backing plate having varying stiffness at different locations thereof correlated to said different localized stresses at different locations within said target, thereby reducing stresses in said sputtering target during said sputtering operation.

2. The sputtering target assembly of claim 1 wherein said backing plate has a varying thickness across said region.

3. The sputtering target assembly of claim 2 wherein the thickness of said backing plate across said region has a smooth taper.

4. The sputtering target assembly of claim 1 wherein said backing plate includes stiffness-modifying structures which affect the stiffness of said backing plate at different locations in said region.

5. The sputtering target assembly of claim 4 wherein said stiffness-modifying structures are defined by machining, molding, or forging during manufacture of said backing plate.

6. The sputtering target assembly of claim 4 wherein said stiffness-modifying structures are defined by machined or drilled voids in said backing plate.

7. The sputtering target assembly of claim 4 wherein said stiffness-modifying structures are defined by support structures at the perimeter of said backing plate.

8. The sputtering target assembly of claim 1 wherein said backing plate, said sputtering target, and said region of attachment, are substantially circular.

9. The sputtering target assembly of claim 8 wherein said backing plate is stiffer near the center than near the perimeter of said region.

10. A sputtering target assembly comprising a sputtering target of sputtering material having a sputtering face and a rear face, and a backing plate, a region of said backing plate attached to said rear face of said sputtering target with a bonding material, said target being subjected to localized thermo-mechanical and pressure differential stresses at different locations within said target during a sputtering operation, said bonding material having varying stiffness at different locations across said region correlated to said different localized stresses at different locations within said target, thereby reducing the stresses in said sputtering target during said sputtering operation.

11. The sputtering target assembly of claim 10 wherein said bonding material is solder.

12. The sputtering target assembly of claim 10 wherein said bonding material has a varied composition.

13. The sputtering target assembly of claim 10 wherein said bonding material has a varying thickness across said region.

14. The sputtering target assembly of claim 10 wherein said backing plate, said target, and said region of attachment are substantially circular.

15. The sputtering target assembly of claim 14 wherein said bonding material is stiffer near the center of said region than near the perimeter of said region.

16. A method of manufacturing a sputtering target assembly comprising forming a sputtering target of sputtering material having a sputtering face and a rear face, forming a backing plate, and attaching a region of said backing plate to said rear face of said sputtering target, said target being subjected to localized thermo-mechanical and pressure differential stresses at different locations within said target during a sputtering operation, said region of said backing plate having varying stiffness at different locations thereof correlated to said different localized stresses at different locations within said target, thereby reducing the stresses in said sputtering target during said sputtering operation.

17. The method of claim 16 wherein forming said backing plate comprises forming said region to include a smoothly tapered thickness across said region.

18. The method of claim 16 wherein forming said backing plate comprises forming stiffness-modifying structures which affect the stiffness of said backing plate in said region.

19. The method of claim 18 wherein forming said structures comprises machining, molding, or forging said structures during manufacture of said backing plate.

20. The method of claim 18 wherein forming said structures comprises machining or drilling voids into said backing plate.

21. A method of manufacturing a sputtering target assembly comprising forming a sputtering target of sputtering material having a sputtering face and a rear face, and forming a backing plate, attaching a region of said backing plate to said rear face of said sputtering target with a bonding material, said target being subjected to localized thermo-mechanical and pressure differential stresses at different locations within said target during a sputtering operation, said bonding material having varying stiffness at different locations across said region correlated to said different localized stresses at different locations within said target, thereby reducing the stresses in said sputtering target during said sputtering operation.

22. The method of claim 21 wherein said bonding material is solder.

23. The method of claim 21 wherein said bonding material has a varying thickness across said region.

24. The method of claim 21 wherein said bonding material has a varying composition across said region.

25. A method of sputtering an article in a sputtering chamber, comprising placing in said sputtering chamber a target comprising a sputtering target of sputtering material attached to a backing plate in a region in which said backing plate has varying stiffness at different locations thereof correlated to different localized stresses experienced during sputtering at different locations within said target, thereby reducing the stresses in said sputtering target during sputtering, placing said article to be sputtered in said chamber in sputter-coating relation to said target, establishing a vacuum in said chamber and igniting gas plasma within said chamber in an ion-bombarding relation to said target, bombarding said target with ions from said plasma, permitting particles of target material dislodged by said bombarding to coat said article.

* * * * *